United States Patent
Lei

(10) Patent No.: US 8,749,294 B2
(45) Date of Patent: Jun. 10, 2014

(54) LOW PIN COUNT HIGH VOLTAGE ULTRASOUND TRANSMITTER AND METHOD THEREFOR

(75) Inventor: Jimes Lei, Milpitas, CA (US)

(73) Assignee: Supertex, Inc., Sunnyvale, CA (US)

( * ) Notice: Subject to any disclaimer, the term of this patent is extended or adjusted under 35 U.S.C. 154(b) by 670 days.

(21) Appl. No.: 12/986,968

(22) Filed: Jan. 7, 2011

(65) Prior Publication Data

US 2011/0176390 A1 Jul. 21, 2011

Related U.S. Application Data

(60) Provisional application No. 61/295,521, filed on Jan. 15, 2010.

(51) Int. Cl.
*H03K 17/00* (2006.01)
*H04B 1/02* (2006.01)
*H03K 17/693* (2006.01)
*G01S 1/72* (2006.01)

(52) U.S. Cl.
CPC ............... *H03K 17/693* (2013.01); *G01S 1/72* (2013.01); *Y10S 367/903* (2013.01)
USPC .................. 327/408; 367/137; 367/903

(58) Field of Classification Search
USPC .................. 367/137, 903, 105; 327/108, 408
See application file for complete search history.

(56) References Cited

U.S. PATENT DOCUMENTS

| | | | | |
|---|---|---|---|---|
| 4,563,899 | A * | 1/1986 | Nakamura | 73/626 |
| 5,199,299 | A * | 4/1993 | Hughes et al. | 73/610 |
| 5,997,479 | A * | 12/1999 | Savord et al. | 600/447 |
| 6,126,602 | A * | 10/2000 | Savord et al. | 600/447 |
| 6,856,175 | B2 * | 2/2005 | Wodnicki | 327/108 |
| 7,872,399 | B2 * | 1/2011 | Kondou et al. | 310/334 |
| 2008/0066552 | A1 * | 3/2008 | Amemiya | 73/602 |
| 2008/0238532 | A1 * | 10/2008 | Hanazawa et al. | 327/534 |
| 2008/0264171 | A1 * | 10/2008 | Wodnicki | 73/618 |
| 2008/0300490 | A1 * | 12/2008 | Chiang et al. | 600/459 |
| 2009/0182229 | A1 * | 7/2009 | Wodnicki | 600/437 |
| 2009/0182233 | A1 * | 7/2009 | Wodnicki | 600/443 |
| 2010/0113935 | A1 * | 5/2010 | Koen et al. | 600/459 |
| 2010/0113936 | A1 * | 5/2010 | Oguzman et al. | 600/459 |
| 2010/0201428 | A1 * | 8/2010 | Chu | 327/408 |
| 2011/0002153 | A1 * | 1/2011 | Gravez et al. | 365/51 |

* cited by examiner

*Primary Examiner* — Isam Alsomiri
*Assistant Examiner* — Hovhannes Baghdasaryan
(74) *Attorney, Agent, or Firm* — Weiss & Moy, P.C.; Jeffrey D. Moy

(57) ABSTRACT

An integrated single channel or multi-channel ultrasound transmitter that minimizes the number of input connections to a controller such as an FPGA, field programmable gate array, or a custom integrated circuit in an ultrasound system. The method is accomplished by integrating, in low voltage logic, a means to store and or program the patterns required for the transmitter output. The number of logic input connections can be further reduced by further integrating, in low voltage logic, programmable individual time delays and frequency divider for each transmitter output.

8 Claims, 9 Drawing Sheets

One Channel of the Present Invention
with Integrated Programmable Time Delay, Frequency Divider, and Pattern

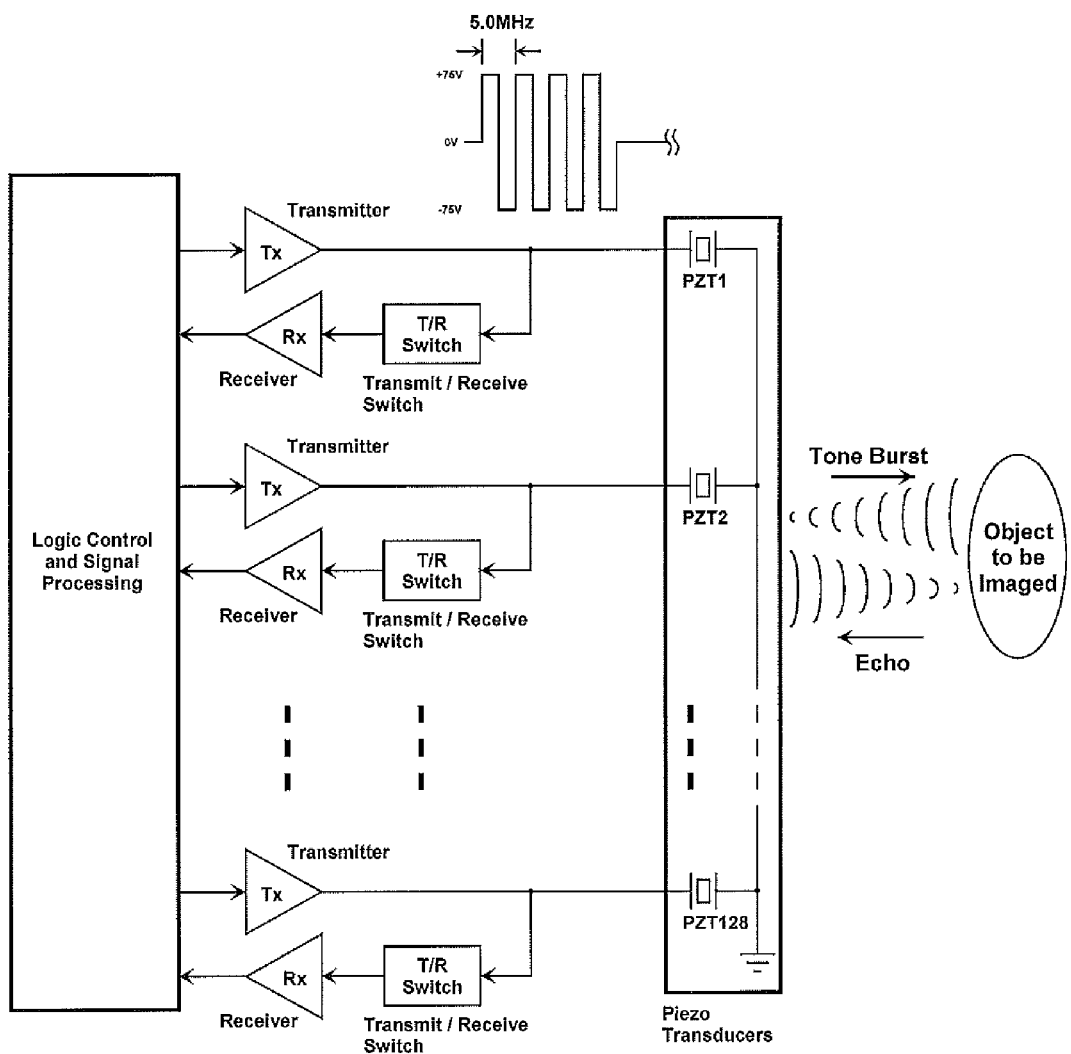
Figure 1: Example of a 128 Channel Ultrasound System (Prior Art)

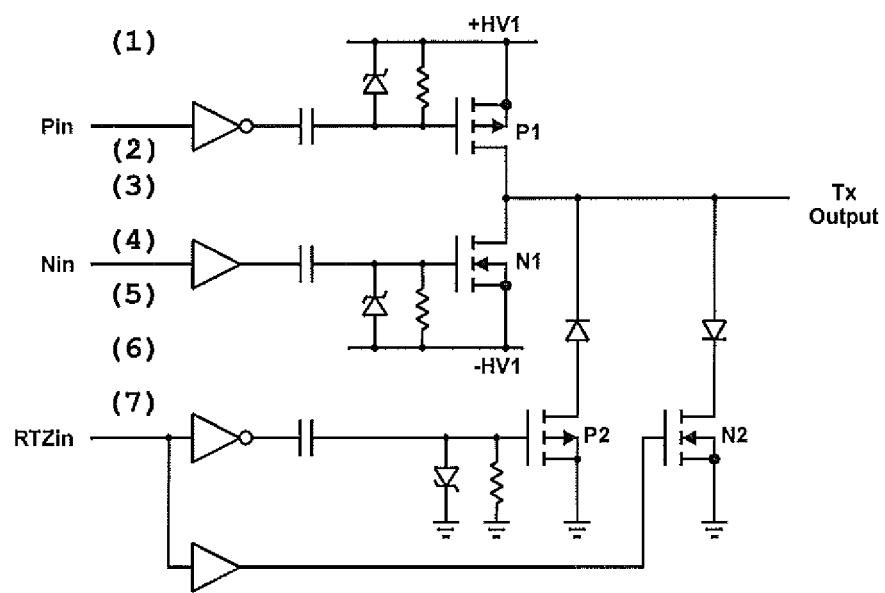
Figure 2: Typical Discrete Transmitter (Prior Art)

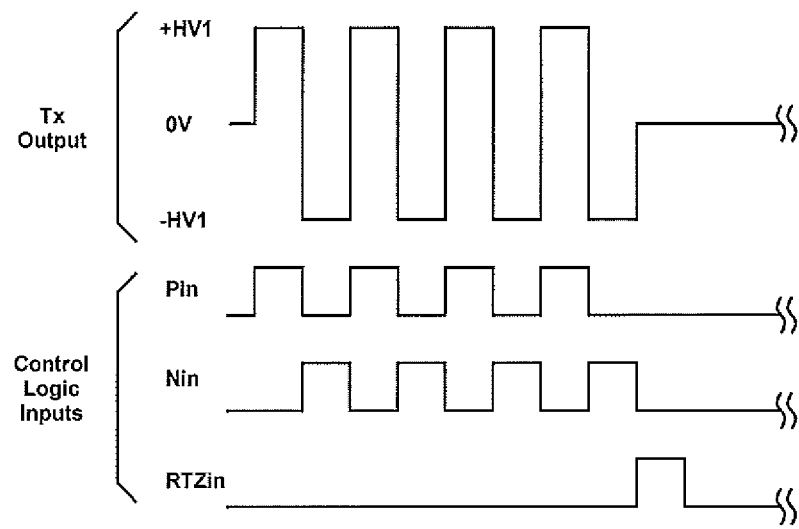
Figure 3: Logic Inputs for Four Cycle Burst
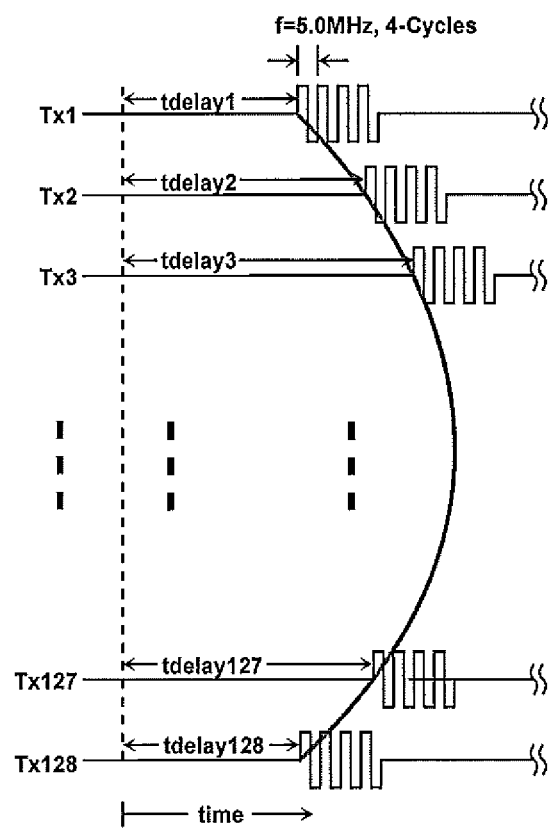
Figure 4: Typical Waveform of a 128 Channel System

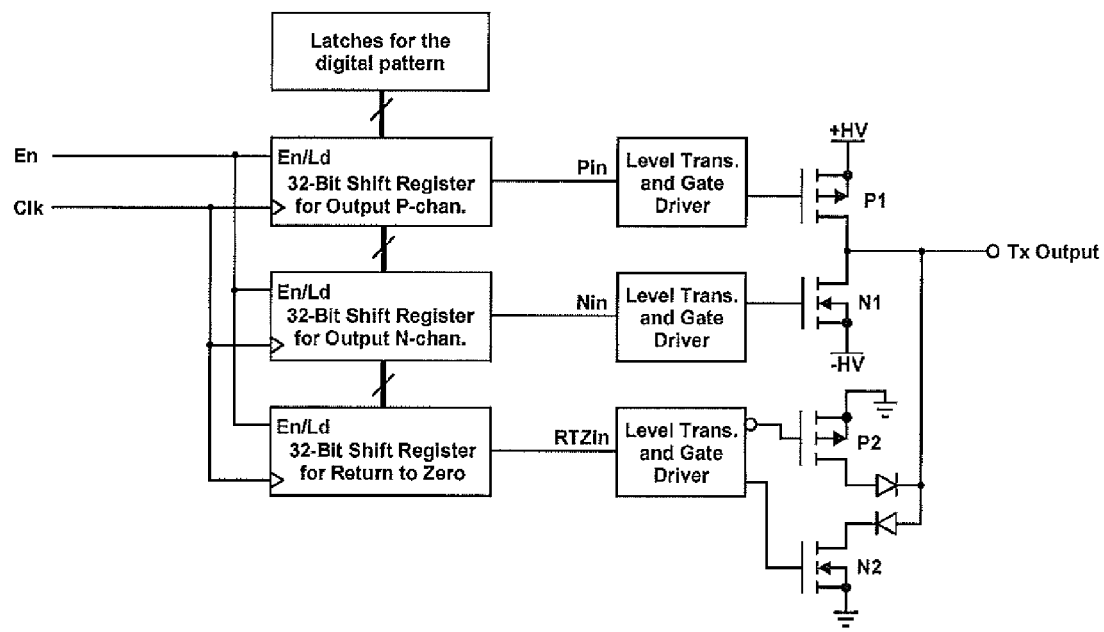
Figure 5: Transmitter with Serial Shift Registers
and Latches of the Present Invention
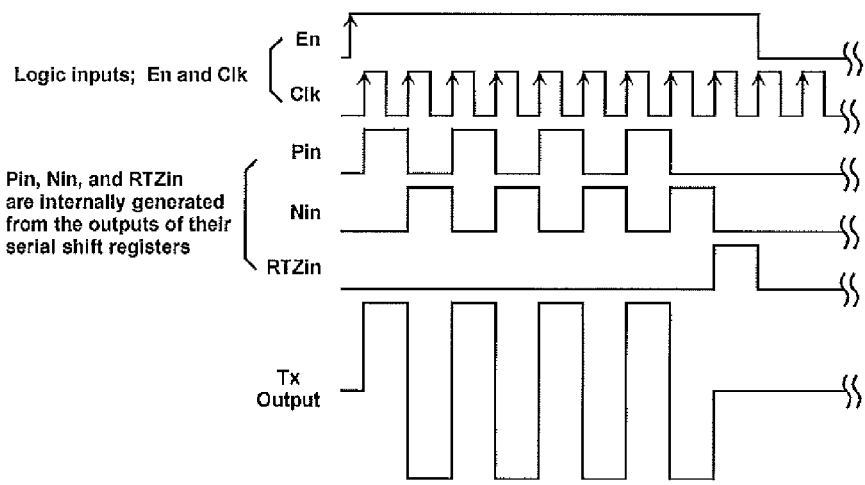
Figure 6: Expected Waveforms of the Present Invention

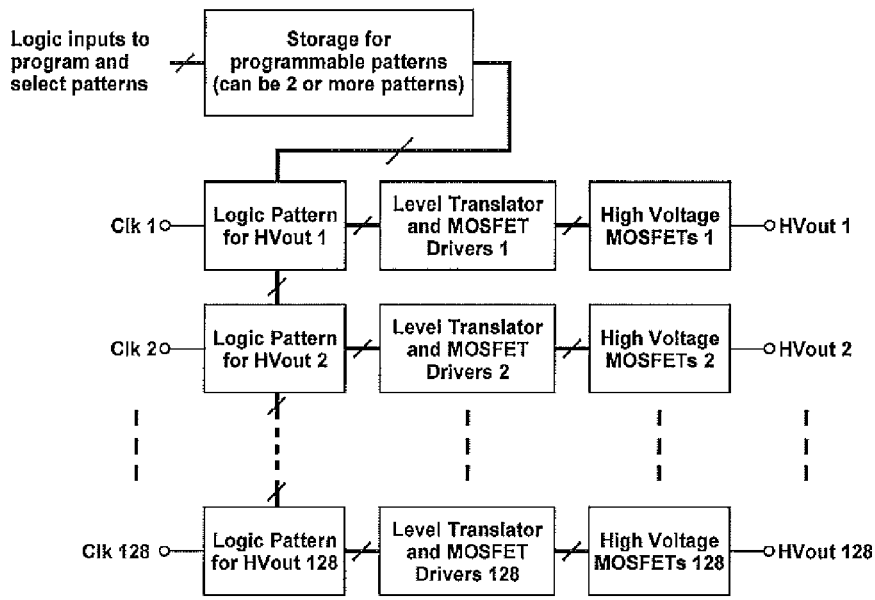
Figure 7: 128 Channel System Block Diagram of the Present Invention with Programmable Patterns
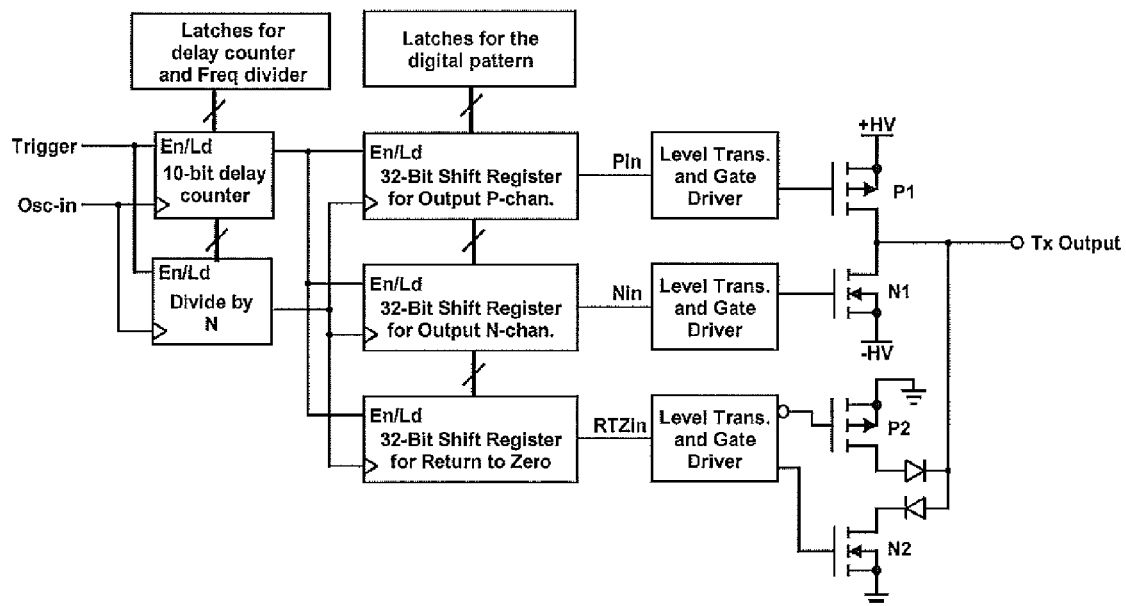
Figure 8: One Channel of the Present Invention with Integrated Programmable Time Delay, Frequency Divider, and Pattern

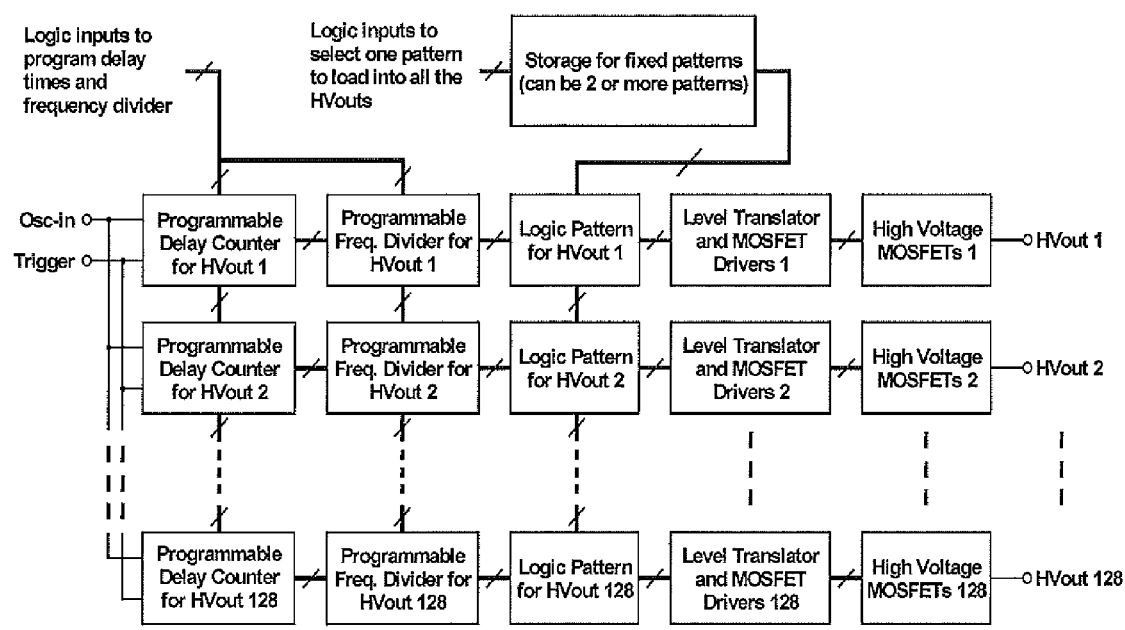
Figure 9: 128 Channel System Block Diagram of the Present Invention with Programmable Time Delay, Frequency Divider, and Pattern

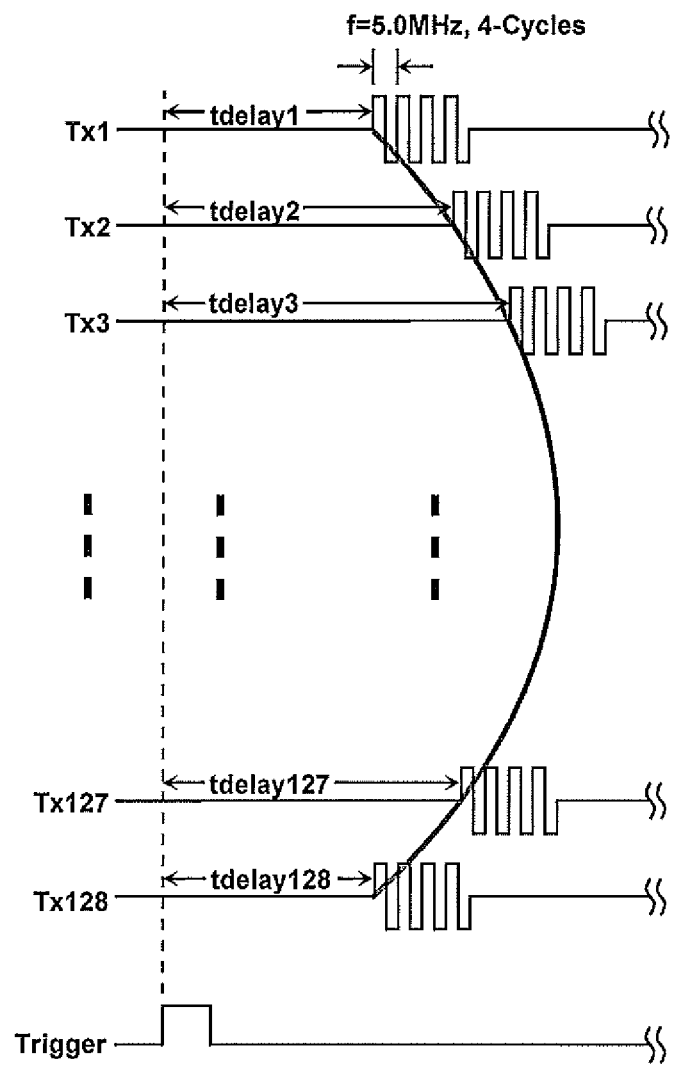
Figure 10: 128 Transmitter Outputs with a Single Trigger Input

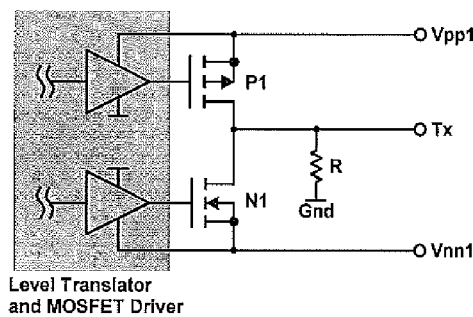
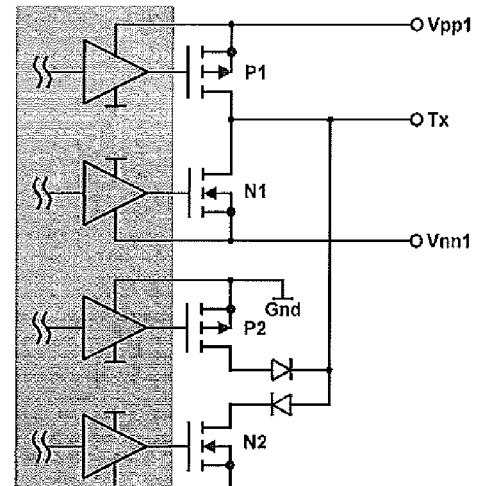
Figure 11A-11B: Output Stage for 2-Level and 3-Level Transmitter

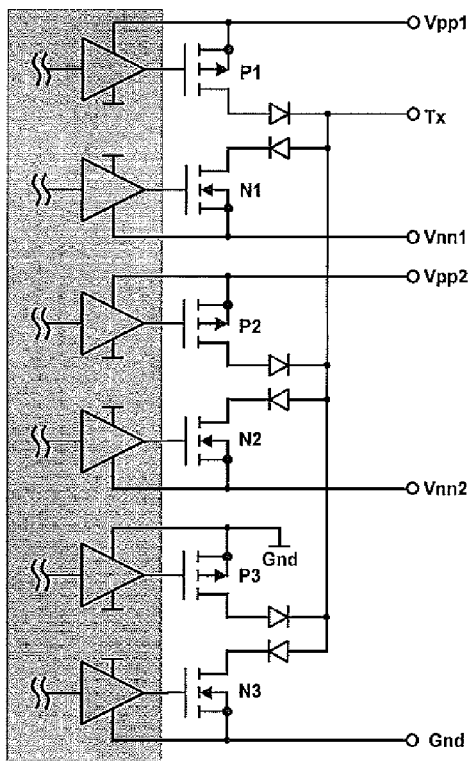
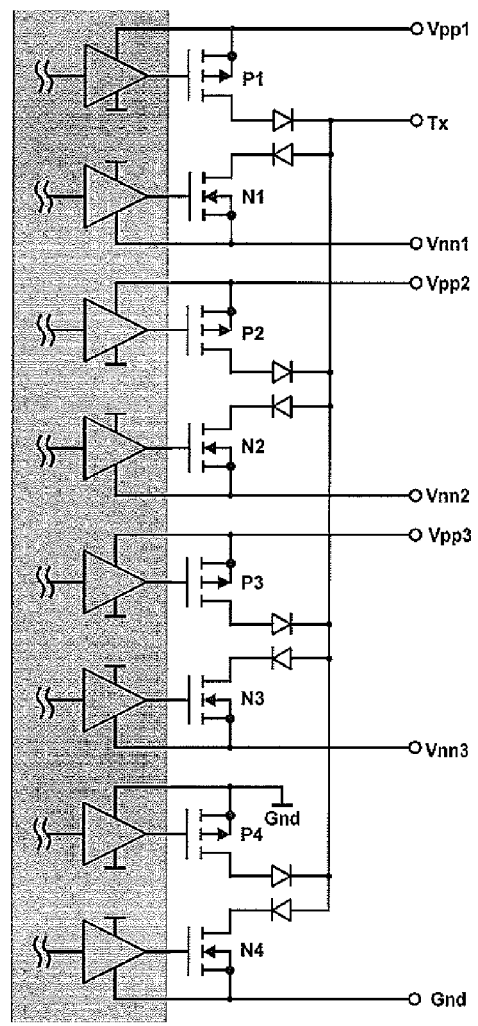
Figure 12A-12B: Output Stage for 5-Level and 7-Level Transmitter

LOW PIN COUNT HIGH VOLTAGE ULTRASOUND TRANSMITTER AND METHOD THEREFOR

CROSS-REFERENCE TO RELATED APPLICATIONS

This application claims the benefit of U.S. Provisional Application No. 61/295,521 filed Jan. 15, 2010, in the name of the same inventor, which is incorporated herein by reference in its entirety

BACKGROUND

Referring to FIG. 1, a prior art ultrasound system is shown. The fundamental principle of ultrasound imaging is to use acoustic waves to help image an object. The basic blocks for ultrasound imaging is the use of an array of piezoelectric transducers in which each transducer will require a high voltage transmitter block, a transmit/receive switch block, and a low noise receiver block. Within the block Logic Control and Signal Processing block, the logic control portion determines the outcome of each transmitter and the signal processing portion uses the information from the receiver to create an ultrasound image.

The drawing in FIG. 1 shows an example of a 3-level transmitter with a burst of 4-cycles of 5.0 MHz, ±75V into a piezoelectric transducer. 3-levels implies the transmitter has transistors that would pull the output to three different voltage levels: +75V, 0V, and −75V. The amplitude may be adjusted by lowering the +75V and −75V supply rails. The burst may be consisted of one cycle or more cycles depending on what particular image mode the system is in. The transmitter frequency may be adjusted from 1.0 MHz to 15 MHz. There is a transmit/receive switch which is used to protect the receiver's input against the ±75V transmit signal. The transmit signal may cause the piezoelectric transducer to vibrate thereby creating an acoustic wave. The acoustic wave may hit the object to be imaged. An acoustic echo may be bounced back into the transducer. The transducer may now convert the acoustic echo into an electric signal which is normally no greater than a few 100 millivolts. The transmit/receive switch allows the small electrical signal to pass into the receiver. The signal from the receiver may be used to help reconstruct a small part of the image. The remaining transmitters may be used in a similar fashion to help construct a complete ultrasound image of the object.

The 3-level transmitter needs to be able to drive the transducer to a positive voltage, a negative voltage and to ground. FIG. 1 shows the positive voltage as +75V and the negative voltage as −75V. A typical implementation of a discrete 3-level transmitter is shown in FIG. 2 where +HV1 is an adjustable positive supply voltage and −HV1 is an adjustable negative supply voltage.

The 3-level transmitter shown in FIG. 2 may have three logic input controls for a given 3-level transmitter: Pin, Nin, and RTZin. When the logic input Pin is high, it may turn on transistor P1 which may then pull the output to +HV1. When the logic input Nin is high, it may turn on transistor N1 which may then pull the output to −HV1. When the logic input RTZin is high, it may turn on both transistors P2 and N2 which will then pull the output to ground. The logic input names may be better understood with the following explanation. "Pin" may be referred to as the logic input to control the output going positive. Similarly, "Nin" may be referred to as the logic input to control the output going negative. "RTZin" may be the logic input to control the output to return-to-zero. Input logic conditions where both P1 and N1 are on should be avoided as this will short the +HV1 supply voltage to the −HV1 supply voltage. Also, when P2 and N2 are on, P1 and N1 should be kept off. FIG. 3 shows an example of what the individual logic inputs would need to be to create a burst of four high voltage cycles on the transmitter output.

FIG. 4 shows how the transmitter outputs referenced to each other in a 128 channel system may look like. Each transmitter output may have a certain amount of delay time. System designers may require the flexibility to adjust the individual delay times, the output frequency, the waveform, and the number of cycles. Individual controls on when the output goes positive, negative, and ground are therefore needed. This allows them to optimize the output pattern to obtain the best possible image. Discrete and integrated transmitters today would have at least two or three input controls per transmitter. For a system requiring 128 transmitters the number of control logic pins for the transmitters would be 128 times two which is 256 control lines or times three which is 384 control lines. The controller may be one or more FPGA's with very large I/O capability or one or more custom ICs with very large I/O capability. The large number of connections causes PC board layout issues, PC board space issues, higher cost FPGA's, and reliability concerns. For systems requiring larger number of transmitters, the number of control lines will grow proportionally. The situation will obviously become worst for portable applications where board space becomes a premium. In an ultrasound system, the need for an integrated transmitter that can significantly reduces the number of logic input connections but still allows system designers the flexibility to optimize the output patterns is therefore warranted.

Therefore, it would be desirable to provide a system and method that overcomes the above.

SUMMARY

In accordance with one embodiment, an ultrasound transmitter is disclosed. The ultrasound transmitter has control logic circuitry. The control logic circuitry has a single input trigger to switch to at least two different voltage levels. A high voltage output driver circuit is coupled to the control logic circuitry.

In accordance with one embodiment, an ultrasound transmitter is disclosed. The ultrasound transmitter has a control logic circuit having a single input trigger to switch to at least two different voltage levels. The control logic circuit has a shift register for each voltage level output of the transmitter. The shift register defines a high voltage output pattern for each voltage level output of the transmitter. A latch is coupled to the shift register for sending data to the shift register to define the voltage output pattern for each voltage level output of the transmitter. A high voltage output driver circuit is coupled to the control logic circuitry.

In accordance with another embodiment of the present invention, a multi-channel ultrasound system is disclosed. The multi-channel ultrasound system has an ultrasound transmitter for each channel of the multi-channel ultrasound system. A single input trigger is used to switch to at least two different voltage levels for each ultrasound transmitter.

The features, functions, and advantages can be achieved independently in various embodiments of the disclosure or may be combined in yet other embodiments.

BRIEF DESCRIPTION OF THE DRAWINGS

Embodiments of the disclosure will become more fully understood from the detailed description and the accompanying drawings, wherein:

FIG. 1 is a block diagram of a prior art 128 Channel ultrasound system; and

FIG. 2 is a diagram of a typical discrete transmitter used in the ultrasound system of FIG. 1;

FIG. 3 shows one example of logic inputs for four cycle burst for the system of FIG. 1;

FIG. 4 shows one example of typical transmitter waveforms of the 128 channel system of FIG. 1;

FIG. 5 shows one example of a transmitter of the present invention;

FIG. 6 shows one embodiment of the expected waveforms of the transmitter of FIG. 5;

FIG. 7 is a block diagram of one embodiment of a multichannel ultrasound system using a transmitter of the present invention;

FIG. 8 shows a more detailed diagram of the transmitter of the present invention;

FIG. 9 is a more detailed block diagram of the multichannel ultrasound system using a transmitter of the present invention;

FIG. 10 shows one example of the ultrasound transmitter output for the system of FIG. 9;

FIGS. 11A-11B show one embodiment of the output stages for a 2-level and 3-level ultrasound transmitter; and FIGS. 12A-12B show one embodiment of the output stages for a 5-level and 7-level ultrasound transmitter.

DETAILED DESCRIPTION

Referring now to FIG. 5, a system and method for reducing the number of connections to an integrated transmitter will be described. One way to reducing the number of connections to an integrated transmitter may be to integrate logic circuitry to control the three inputs: Pin, Nin, and RTZin. FIG. 5 shows a block diagram of one embodiment of the present invention using serial shift registers and latches to store the digital pattern for each of the three inputs.

The transmitter 10 may consists of three serial shift registers 12A-12C and a latch 14. In the embodiment shown in FIG. 5, the shift registers 12A-12C may be 32-Bit shift registers while the latch 14 may be a 96 bit latch.

The latch 14 may be used to hold the data for Pin, Nin and RTZIN. In the present embodiment, the 96-bit latch 14 holds 32-bits of data for Pin 12A, 32-bits of data for Nin 12B, and 32-bits of data for RTZin 12C. The three serial shift registers 12A-12C may share a common clock pin, Clk. The data in the shift registers 12A-12C may be shifted during low to high clock transition. Once the data for the latch 14 is stored, it may be transferred to the three serial shift registers 12A-12C when the enable logic input, En, detects a low to high transition.

The outputs of each serial shift registers 12A-12C generate the desired Pin, Nin, and RTZin signals respectively. This eliminates the need for having external connections for Pin, Nin, and RTZin. The data in the serial shift register 12A-12C may be shifted out via the clock pin when the En pin is high. With the desired data loaded in the serial shift registers 12A-12C, the Tx output waveform on FIG. 3 may be executed with a single input control, En and a clock signal, Clk. This is shown in FIG. 6.

The programmable serial shift register approach results in an arbitrary pattern generator because it may allow for any digital pattern to be created. Some more simplified systems may have just a few fixed patterns so programmability in these situations is optional.

Alternative methods of the present invention may be to replace the programmable pattern generator with fixed predetermined patterns. Another method of the present invention may be to replace the serial shift registers with programmable state machines. Yet, another method of the present invention may be to replace the serial shift registers with small programmable counter that counts how many cycles the transmitter output will send out. Once completed, it can end with a return to zero.

Each channel has its own clock signal to push the data out of the serial shift registers 12A-12C. Each clock line has its own delay time to allow the system to do beamforming. It may be considered as an acoustic lens and the curvature due to the delay times performs the focusing. 128 clock signals are needed in the present embodiment. The output frequency is controlled by adjusting the clock frequency. The number of logic inputs per transmitter is reduced from three to one.

Referring now to FIG. 7, one embodiment of an ultrasound transmitter system 100 is shown. In the present embodiment, the system 100 is a 128 channel system that reduces the number of control lines from three to one. The block 110 labeled logic pattern for HVout may be the serial shift registers 12A-12C shown in FIG. 5. The blocks 112 labeled High Voltage MOSFETs may be the P1, P2, N1, N2 and the two diodes D1 and D2 shown in FIG. 5. The number of control lines can be further reduced by integrating a programmable time delay and a programmable frequency divider to generate the desired clock signals for each transmitter output.

FIG. 8 shows the schematic of a single channel 200 of the present invention with a programmable time delay and frequency divider circuit integrated. A counter 202 may be used for a time delay. In the present embodiment, a 10-bit counter may be used. Latches 204 may be used to program and store the data for the counter 202. Input Osc-in can be used as the clock input for the counter 202. A divide by N frequency divider 206 may also be used. The frequency divider 206 may be used to divide the Osc-in frequency by N. The value for N may also be programmable and may be stored in the latch 204. The frequency divider 206 sets the clock frequency for the serial shift registers 212A-212C.

Once the Trigger input is activated, the stored data for the delay counters 202, frequency divider 206, and output patterns may be loaded. The counter 202 may start counting down and the frequency divider 206 may divide the Osc-in frequency by N. Once the counter counts down to zero, the clock signal may be applied to the three serial shift registers 212A-212C thereby generating the appropriate Pin, Nin, and RTZin signals.

Referring now to FIG. 9, a block diagram of a 128 channel system 300 of the present invention is shown. The system 300 reduces the number of control lines per system to just a single input trigger. The block 310 labeled logic pattern for HVout may be the serial shift registers 12A-12C shown in FIG. 5. The block labeled High Voltage MOSFETs 312 may be the P1, P2, N1, N2 and the two diodes D1, D2 shown in FIG. 5.

Referring now to FIG. 10, the waveforms for the system with 128 transmitter channels with integrated programmable time delay is shown. The 128 enable inputs may be replaced with two logic input pins, Trigger and Osc-in as shown in FIGS. 8 and 9. The topology of the present invention is independent of system channel. For example, a system requiring 256 channel may only need a single trigger pin to activate all 256 channels. The objective of the present invention of reducing the number of control lines for the transmitter has been achieved.

The present invention is not limited to just 3-level outputs. The present invention can be extended to 2-level outputs, 5-level outputs, and 7-level outputs. The output stage for a 2-level and 3-levels are shown in FIGS. 11A and 11B. The number two for 2-levels represents two active transistors to set the output to two different voltage levels. In this case, it is active device P1 to set the output to Vpp1 and N1 to set the output to Vnn1. To provide a few examples, for Vpp1=+150V and Vnn1=0V, the output can swing from 0V to +150V. As a second example, for Vpp1=0V and Vnn1=−150V, the output can swing from −150V to 0V. For a third example, Vpp1=+75V and Vnn1=−75V, the output can swing from −75V to +75V with a slow decay to 0V from resistor R. The 2-level transmitter will only need 2 sets of serial shift registers as compared to 3 sets for the 3-level transmitter. 2-level transmitter serves a lower end ultrasound market segment where performance versus cost is traded off.

The outputs for 5-levels and 7-levels outputs are shown in FIG. 12A-12B. The 5-level and 7-level serve the higher end ultrasound machines. Additional shift registers will be required for the additional levels. The implementation is the same as the 3-level transmitter. The reduction on control pins of the present invention will benefit the whole market segment from low end to high end.

While embodiments of the disclosure have been described in terms of various specific embodiments, those skilled in the art will recognize that the embodiments of the disclosure can be practiced with modifications within the spirit and scope of the claims.

What is claimed is:

1. An ultrasound transmitter comprising:
control logic circuitry having a single input trigger to switch to at least two different voltage levels, wherein the control circuitry comprises:
a shift register for each voltage level output of the transmitter, wherein the shift register defines a high voltage output pattern for each voltage level output of the transmitter; and
a latch coupled to the shift register for sending data to the shift register;
a high voltage output driver circuit coupled to the control logic circuitry;
a counter having an input coupled to the single input trigger and an output coupled to each shift register; and
a frequency divider having an input coupled to the single input trigger and an output coupled to the counter; and
wherein an oscillator signal is coupled to an input of the frequency divider and an input of the counter.

2. The ultrasound transmitter of claim 1, wherein the control logic circuitry switches between two voltage levels, where the two voltage levels is one of: a positive voltage and ground, a negative voltage and ground, or a positive voltage and a negative voltage.

3. The ultrasound transmitter of claim 1, wherein the control logic circuitry switches between three different voltage levels, the three different voltage levels being a positive voltage, a negative voltage, and ground.

4. The ultrasound transmitter of claim 1, wherein the control logic circuitry switches between five different voltage levels, the five different voltage levels being a first positive voltage, a second positive voltage, a first negative voltage, a second negative voltage, and ground.

5. The ultrasound transmitter of claim 1, wherein the control logic circuitry switches between seven different voltage levels, the seven different voltage levels being a first positive voltage, a second positive voltage, a third positive voltage, a first negative voltage, a second negative voltage, a third negative voltage, and ground.

6. The ultrasound transmitter of claim 1, wherein the high voltage output circuit which outputs two voltage levels comprises:
a P-type transistor having a first terminal coupled to a first voltage level, a second terminal coupled to the control logic circuitry, and a third terminal coupled to an output terminal of the ultrasound transmitter; and
an N-type transistor having a first terminal coupled to the output terminal of the ultrasound transmitter, a second terminal coupled to the control logic circuitry, and a third terminal coupled to a second voltage level.

7. The ultrasound transmitter of claim 1, wherein the high voltage output circuit which outputs three voltage levels comprises:
a first P-type transistor having a first terminal coupled to a first voltage level, a second terminal coupled to the control logic circuitry, and a third terminal coupled to an output terminal of the ultrasound transmitter;
a first N-type transistor having a first terminal coupled to the output terminal of the ultrasound transmitter, a second terminal coupled to the control logic circuitry, and a third terminal coupled to a second voltage level;
a second P-type transistor having a first terminal coupled to ground, a second terminal coupled to the control logic circuitry, and a third terminal coupled to an output terminal of the ultrasound transmitter;
a second N-type transistor having a first terminal coupled to the output terminal of the ultrasound transmitter, a second terminal coupled to the control logic circuitry, and a third terminal coupled to ground;
a first diode coupled to the third terminal of the second N-type transistor and to the output terminal of the ultrasound transmitter; and
a second diode coupled to the first terminal of the second N-type transistor and to the output terminal of the ultrasound transmitter.

8. The ultrasound transmitter of claim 1, wherein the high voltage output circuit which outputs five voltage levels comprises:
a first P-type transistor having a first terminal coupled to a first voltage level, a second terminal coupled to the control logic circuitry, and a third terminal coupled to an output terminal of the ultrasound transmitter;
a first N-type transistor having a first terminal coupled to the output terminal of the ultrasound transmitter, a second terminal coupled to the control logic circuitry, and a third terminal coupled to a second voltage level;
a second P-type transistor having a first terminal coupled to a third voltage level, a second terminal coupled to the control logic circuitry, and a third terminal coupled to an output terminal of the ultrasound transmitter;
a second N-type transistor having a first terminal coupled to the output terminal of the ultrasound transmitter, a second terminal coupled to the control logic circuitry, and a third terminal coupled to a fourth voltage source;
a third P-type transistor having a first terminal coupled to ground, a second terminal coupled to the control logic circuitry, and a third terminal coupled to an output terminal of the ultrasound transmitter;
a third N-type transistor having a first terminal coupled to the output terminal of the ultrasound transmitter, a second terminal coupled to the control logic circuitry, and a third terminal coupled to ground;
a first pair of diodes coupled to the first P-type transistor and the first N-type transistor and the output terminal of the ultrasound transmitter;
a second pair of diodes coupled to the second P-type transistor and the second N-type transistor and the output terminal of the ultrasound transmitter; and a third pair of diodes coupled to the third P-type transistor and the third N-type transistor and the output terminal of the ultrasound transmitter.

* * * * *